United States Patent [19]

Price

[11] Patent Number: 4,677,520
[45] Date of Patent: Jun. 30, 1987

[54] STATIC CHARGE PROTECTOR FOR INTEGRATED CIRCUITS

[76] Inventor: James Price, 416 Smyth Rd., Manchester, N.H. 03104

[21] Appl. No.: 775,591

[22] Filed: Sep. 13, 1985

[51] Int. Cl.$^4$ .......................... H02H 9/04; H05K 7/06
[52] U.S. Cl. ..................................... 361/220; 361/56; 361/91; 206/331
[58] Field of Search ................. 361/91, 212, 215, 220, 361/56, 55; 174/52 R, 52 PE; 206/328, 329, 331, 332, 334

[56] References Cited

U.S. PATENT DOCUMENTS

| | | | |
|---|---|---|---|
| 3,820,152 | 6/1974 | Booth | 206/328 |
| 4,458,291 | 7/1984 | Yanagisawa et al. | 361/212 |
| 4,532,419 | 7/1985 | Takeda | 361/212 |
| 4,617,605 | 10/1986 | Obrecht et al. | 361/220 |

*Primary Examiner*—L. T. Hix
*Assistant Examiner*—D. Rutledge
*Attorney, Agent, or Firm*—Hayes, Davis & Soloway

[57] ABSTRACT

A protective device for integrated circuits and the like which protects the circuit from static charges and induced voltages resulting from static charges and otherwise. Electrical connections are made to the leads of the circuit terminating in non-contacting relationship within a chamber filled with an ionizable gas. A conductive material is spaced equally on the terminations and connected to the lowest potential of the circuit, typically ground. Over voltages from static charges and the like cause the gas to ionize and discharge the over voltage. A second shield of conductive material is disposed between the gas filled chamber and the circuit and, in turn, connected to an independent point within the chamber. Fields produced as a result of a static discharge, or otherwise, which otherwise would induce over voltages into the circuit cause an induction voltage into the shield material which voltage is then discharged through the ionizable gas.

21 Claims, 16 Drawing Figures

STATIC CHARGE PROTECTOR FOR INTEGRATED CIRCUITS

BACKGROUND OF THE INVENTION

The present invention relates to overvoltage protection devices and, more specifically, to a device for protecting integrated circuits, and the like, from static discharges and associated fields comprising a housing of an electrically insulating material defining a chamber; an ionizable gas disposed within the chamber, and, a plurality of electrical leads carried by the housing in non-contacting relationship with each other communicating with the chamber and the gas on one end and in electrical contact with respect to each one of the electrical leads of the circuit to be protected on the other end.

The necessity to protect electrical and electronic circuits from overvoltages has long been recognized. As electronic circuits have become smaller and smaller, however, the source and power of what constitutes an "overvoltage" has rapidly diminished. Whereas, a lightning strike was the order of magnitude under consideration, more recently, the size of integrated circuits, for example, has diminished to a point where a single electrostatic discharge from walking across the carpet can be catastrophic.

It is widely known within the electronics industry that damage caused by electrostatic discharge is the primary source of unpredictable failure of integrated circuits. Triboelectric charges are produced anytime two surfaces are separated and if one or more of the surfaces is a non-conductor, then a static electric charge is produced. This is a natural phenomena and only becomes a problem if the static charge is allowed to discharge or induce a charge into the integrated circuit. Such electrostatic discharge events can occur very pervasively to a potential of several thousands of volts. The discharge occurs very rapidly and the usual failure or degragation is caused by the gasification of metal within the device resulting in the gasified metal becoming deposited along the trace of the discharge path. Following each such electrostatic discharge event that an integrated circuit is exposed to, the damage may be instantly catastrophic or, on the other hand, the device may just have its useful life put into question. Oftentimes, following such an electrostatic discharge event, the integrated circuit does not totally fail but, rather, remains totally operable yet containing a latent defect that will result in premature failure. Such events can also alter the operating characteristics of the integrated circuit resulting in unsatisfactory and often unpredictable operation.

In addition to the above-described metallic gasification problem resulting from the passage of the high voltage charge through the circuit, high voltage discharge in proximity to the device can produce high electromotive force fields that can induce damaging voltages into the circuit.

As stated above, overvoltage protection circuits are not new in the art. Some examples of various devices known in the art can be seen with reference to the following U.S. Pat. Nos. 1,656,956; 2,620,453; 2,967,256; 3,934,175; 4,037,139; 4,105,929; 4,207,603; 4,293,887; 4,318,149; and 4,438,477. In the field of integrated circuits and other similar, miniature, low voltage devices, primary emphasis has been on protection of the device during manufacture, transportation, and assembly. Typical examples of such devices can be seen with reference to U.S. Pats. Nos. 3,638,071 and 4,084,210. Primarily the intent is to electrically interconnect all the leads of the device during shipment and assembly when the device is inactive. The protective means are then removed prior to actual use of the inetegrated circuit. There has been some attempts to provide protection for such electrical devices on a more permanent nature. For an example as shown in U.S. Pat. No. 3,742,420, wherein the wafer of metallic oxide varistor material has the leads of an electrical device pass therethrough. At normal, low operating voltages, very little current flows through the wafer material between the leads of the device. At higher voltages, however, the leads are purportedly electrically inter-connected. Such an approach might work for some devices where the slight current flow between the various leads does not effect normal operation of the device. With more sophisticated circuits, however, complete isolation of the leads from one another is necessary to proper operation of the device. Such an approach to protection of the device, would, therefore, not work. A similar approach is shown in U.S. Pat. No. 4,458,291 wherein the intent is only to provide a shunting path for electrostatic charges applied to the device when it is picked up by the edge. No general protection as discussed above is provided. Additionally, as is well known by those skilled in the art, normal assembly of integrated circuits is subjected to procedures such as the use of conductive and/or anti-static materials in the workplace during manufacture, shipping, at handling stations and during assembly and testing. Protective methods include grounding the worker by use of conductive wrist straps and heel straps. In some work areas, ionized air is directed over the work area to neutralize charges. Non-conductors, particularly plastics, are avoided in the work areas and, in many instances, where non-conductors must be used, they are coated with anti-static solutions.

In an attempt to control electrostatic discharge within the design of integrated circuits themselves, many advances have been made. For example, the geometric design of the circuit layout has been improved to avoid sharp angles between potential discharge paths and insulated material added at similar high risk locations within the device. Other methods used to improve immunity to electrostatic discharge damage include the adding of resistors, varistors, zenderdiodes and similar components that will impede or redirect the electrostatic discharge energy away from the critical elements of the device.

Wherefore, it is the main object of the present invention to provide integrated circuits and the like with protection against electrostatic discharge damage, regardless of polarity of the charge or pins carrying the charge.

It is an additional object of the present invention to provide a shield that will also protect the integrated circuit from induced voltages and from fields produced while the protective device is active during an electrostatic discharge event and otherwise.

SUMMARY

The foregoing objectives have been achieved by the overvoltage protector for low voltage electrical devices having a plurality of electrical leads thereto of the present invention comprising a housing of an electrically insulating material defining a chamber; an ionizable gas disposed within the chamber; and, a plurality of electrical leads carried by the housing in non-contacting relationship with each other communicating with the chamber and the gas on one end and in electrical contact with a respective one of the electrical leads on the other end.

In the preferred embodiment, there is an electrically conductive material disposed in the chamber and the space substantially equally from all of the ends of the electrical leads contained therein; and, means for electrically connecting the conductive material to the lowest electrical potential to which the electrical device is connected.

To provide the desired shield, overvoltage protector and the electrical device are disposed in close adjacent spaced relationship; and there is additionally provided a second electrically conductive material disposed between the overvoltage protector and the electrical device; and, an electrical lead carried by the housing communicating with the chamber and the gas on one end and in electrical contact with the electrically conductive material on the other end whereby fields which would otherwise induce and an overvoltage in the electrical device are caused to discharge their energy by inducing a voltage in the electrically conductive material which is then discharged through the gas.

DESCRIPTION OF THE VARIOUS EMBODIMENTS

In its simplest form, the present invention comprises a housing of an electrically insulating material defining a chamber with an ionizable gas disposed within the chamber. A plurality of electrical leads are carried by the housing in non-contacting relationship with each other communicating between the chamber and gas on one end and electrical contact with respective ones of the electrical leads of the device being protected on the other end. Several embodiments will be described hereinafter. As will be recognized by those skilled in the art, the embodiments shown are representative only and other variations can be made within the scope and spirit of the present invention.

Figure 5:
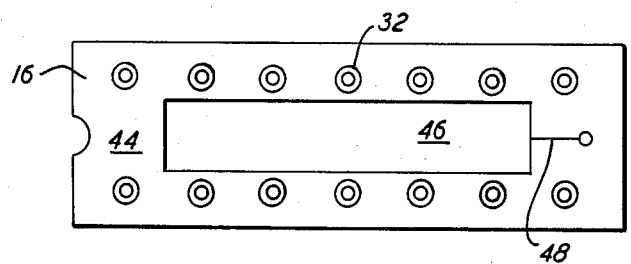
FIG. 5 is a view of the bottom surface of the bottom layer of FIG. 1.
Figure 6:
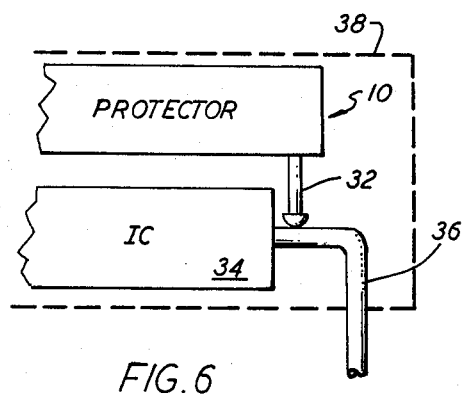
FIG. 6 is a simplified view showing the manner of connecting the protector of FIGS. 1-5 to an integrated circuit within a common case.
Figure 7:
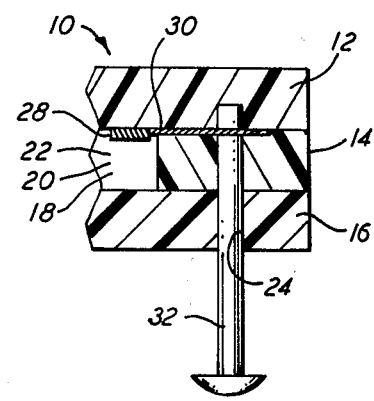
FIG. 7 is a detailed view of the mounting pin of the protector of FIGS. 1-6.

A first embodiment of the present invention is shown in FIGS. 1-7. As will be recognized, some of the features of construction to be described with respect to the first embodiment are adaptable to and/or incorporated in the other embodiments. In FIGS. 1-7, the protector of the present invention is generally indicated as 10. Protector 10 comprises a top layer 12, a middle layer 14, and a bottom layer 16. Each of the layers 12, 14, 16 is of a non-conducting material. Because of the conducting paths formed onto the top and bottom layers 12, 16, it is most convenient to use Printed Circuit Board and Printed Circuit Board fabricating techniques. Other methods known to those skilled in the art could, of course, be utilized. As can be seen, the top and bottom layers, 12, 16 are solid whereas the middle layer 14 has a rectangular slot 18 therethrough. When bonded together as shown in FIG. 7, the three layers 12, 14, 16 in combination with the slot 18 define a chamber 20. If the layers 12, 14, 16 are assembled in an atmosphere of an ionizing gas, it can be appreciated that the chamber 20 will contain that ionizing gas indicated as 22 in the Figures. The type of gas 22 as well as the spacing of the various components, and the like, will determine the ionization voltage of the protector 10. These various factors are readily determinable by those skilled in the art from known information without undue experimentation and, therefore, no particular details will be included herein so that emphasis can be placed on the structure of the various embodiments. Briefly by way of example, however, approximate ionization levels for various gases are 100 volts, neon; 200 volts, xenon; and 300 volts, argon.

As best seen in FIGS. 2-5, the layers 12, 14, 16 are provided with a plurality of peripheral bores 24 therethrough which are in concentric alignment when the layers 12, 14, 16 are assembled. The inward facing surface 26 of the top layer 12 is of a conducting material and is formed using conventional printed circuit techniques to provide a series of spaced non-contacting pads 28 connected by electrical leads 30 to respective ones of the bores 24. The ends of the leads 30 at the bores 24 are adapted to electrically contact pins 32 (these pins could be plated through contacts as will be appreciated by those skilled in the P.C.B. art) inserted into the bores 24 as shown in FIG. 7. As shown in FIG. 6, the protector 10 can then be positioned above or below an integrated circuit 34 with the contacting pins 32 of the protector 10 in contact with respective ones of the mounting pins 36 of the integrated circuit. If desired and for convenience, the protector 10 and integrated circuit 34 can be mounted in a common case as indicated by the dash line 38, with the mounting pins 36 extending therefrom for attachment of the integrated circuit 34 to a printed circuit (not shown) in the usual manner.

Figure 1:
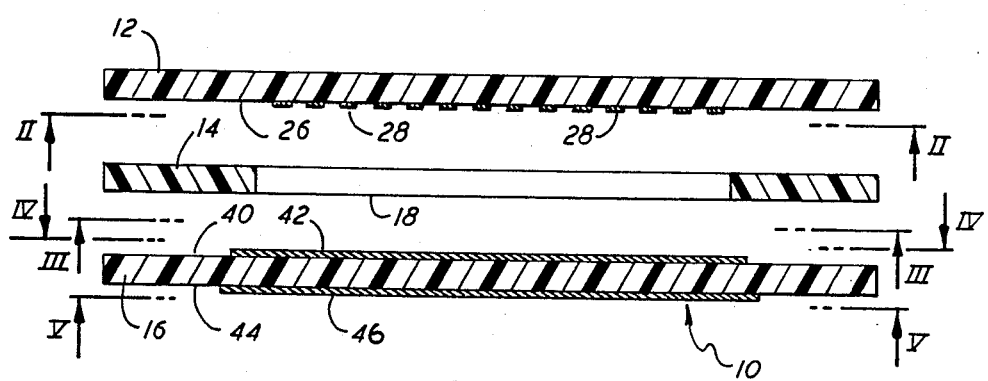
FIG. 1 is a cutaway exploded view through the layers of one embodiment of the present invention.
Figure 2:
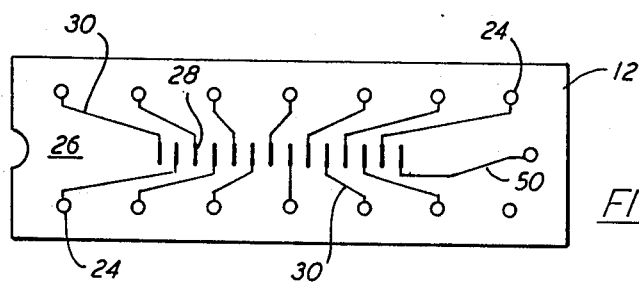
FIG. 2 is a view of the bottom surface of the top layer of FIG. 1.
Figure 3:
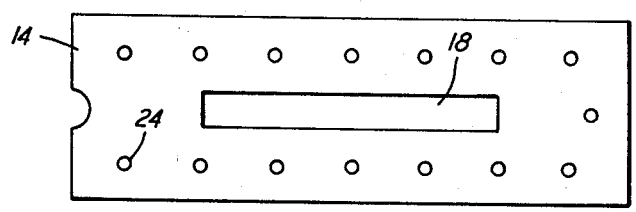
FIG. 3 is a view of the bottom surface of the middle layer of FIG. 1.
Figure 4:
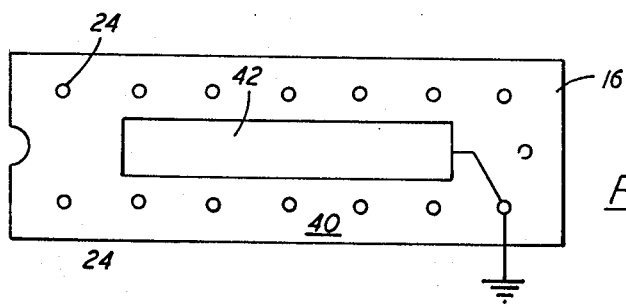
FIG. 4 is a view of the top surface of the bottom layer of FIG. 1.

Returning to the construction of the embodiment of FIGS. 1-7, the bottom layer 16 is shown in top and bottom views in FIGS. 4 and 5, respectively. The inward facing or top surface 40 of the bottom layer 16 has a rectangle of conductive material 42 attached thereto which is slightly larger than the rectangular slot 18 of the middle layer 14. As with the surface 26 of the top layer 12, the conductive material 42 is most easily formed using conventional printed circuit techniques. As can be seen, when the protector 10 is assembled, the conductor material 42 is substantially equally spaced from all of the pads 28. The bottom surface 44 also includes a conductive material 46 of rectangular shape and formed by a similar technique. The conductive material 46 is, again, just slightly larger than the conductive material 42 so as to afford complete protection. Note that the conductive material 46 is electrically connected by line 48 which passes between the layers 12, 14, 16 and connects to a spare pad 28 on the top layer. In this way, the conductive material 46, which is the induction shield, is electrically connected to a point within the chamber 20 and the ionizing gas 22 therein. In a voltage induced into the conductive material 46 as the result of a field which would otherwise damage the integrated circuit to which the protector 10 is placed in close proximity with the conductive material shield 46 disposed therebetween, it is discharged through the ionizing gas 22 in the same manner as an electrostatic discharge appearing at any of the electrical leads 30 is discharged through the gas 22.

As will be noted from FIG. 4, the conductive material 42 is connected by an electric line 50 to a pin 32 which, in turn, is connected to a mounting pin 36 of the integrated circuit 34 which is at the lowest electrical potential to which the integrated circuit 34 is connected. Typically, this potential will be "ground" as indicated by the symbol and FIG. 4.

It should be appreciated by those skilled in the art that for a multiple mounting pin device such as the integrated circuit 34, upon the ionization of the gas 22, all the pins 32, 36 are effectively in contact with the ionizing gas 22 through the leads 30 and pads 28; therefore, the static charge will divide among all the conductors, not just the ones that initiate the event. This is a very desirable feature, because when the electrostatic event is over, all the electrical leads will have tried to seek a common level. Thus, if charges exist on other pins which are less than the ionization potential of the gas 22, an electrostatic discharge event will tend to neutralize these charges at the same time.

It should be noted that resistance can be added to the electrical leads by the design engineer at various points to achieve specific results. For example, a resistor could be built in-line with any of the contacting pins 32 or formed as part of the electrical leads 30. By varying the resistance of the electrical paths between the mounting pins 36 and the pads 28, the ionization voltage level of the gas 22 will not be effected. But the discharge curve and the deionization voltage level can be varied. Since current doesn't flow until the gas 22 is ionized, the flash point is effected very little by the lead resistance. When ionization does occur, the current will flow at maximum and a portion of the voltage will be dropped across the resistance of the leads that are carrying the current. By selection of the lead resistances according to techniques well-known to those skilled in the art, the discharge curve, the ionization level and any radio frequency generation can be controlled.

Figure 8:
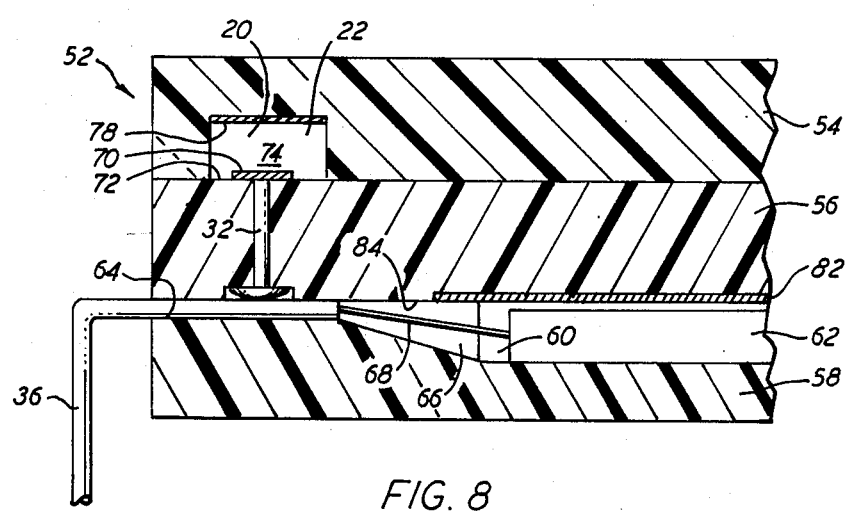
FIG. 8 is a cutaway view to a protector according to a second embodiment of the present invention.
Figure 9:
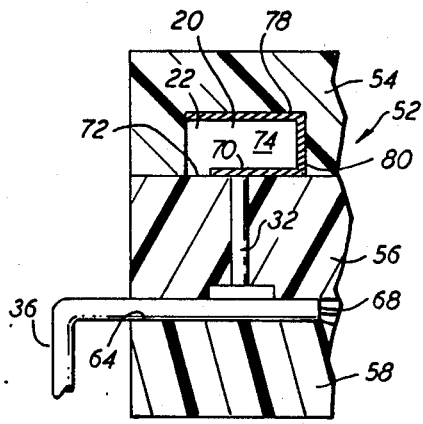
FIG. 9 is a cutaway view through another area of the protector of FIG. 8 showing the manner of grounding employed therein.
Figure 10:
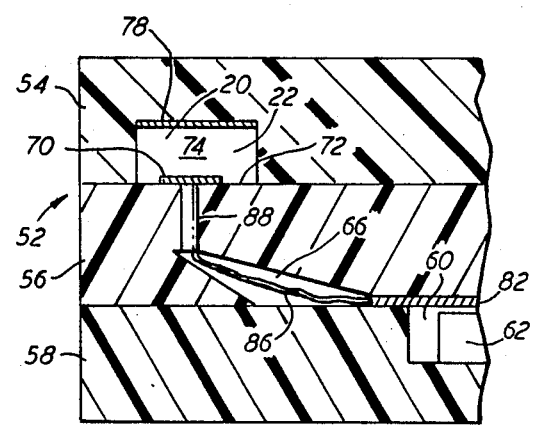
FIG. 10 is a cutaway view through another portion of FIGS. 8-9 showing the manner of connecting the protective shield to the chamber containing the ionized gas.

Turning now to FIGS. 8-10, an alternate embodiment of the present invention is shown wherein the overvoltage or static charge protector 10 of the present invention is incorporated into a case or housing for an integrated circuit chip or the like. In this embodiment, the housing, generally indicated as 52, comprises a top layer 54, a middle layer 56, and a bottom or base layer 58. The bottom layer 58 contains a space 60 therein adapted to hold the integrated circuit chip 62. The bottom layer 58 has a plurality of peripherally spaced slots 64 into which the mounting pins 36 are inserted. Connecting slots 66 are provided between the space 60 and the peripheral slots 64. Wires 68 are disposed in the slots 66 to electrically connect the mounting pins 36 to the IC chip 62.

Figure 12:
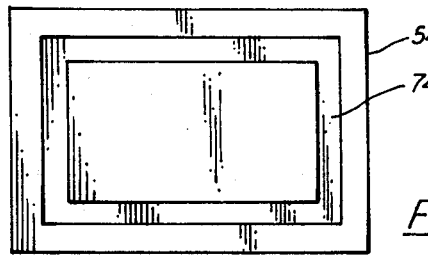
FIGS. 12-14 show in simplified form various configurations for the chamber defining surface when using the embodiments of FIGS. 3 or 11.
Figure 13:
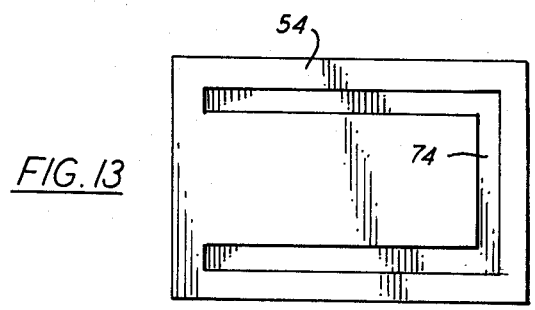
Figure 14:
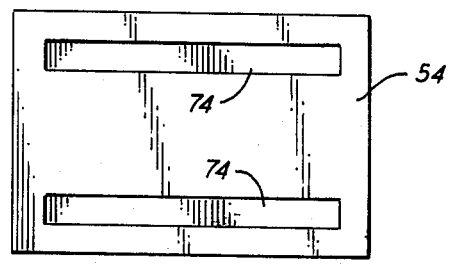

The middle layer 56 is disposed on top of the bottom layer 58. A plurality of conductive pads 70 are disposed on the upper surface 72 by common printed circuit techniques as previously discussed with respect to the first embodiment. The pads 70 are disposed to correspond to respective ones of the mounting pins 36 and are electrically connected to the mounting pins 36 by contacting pins 32 in a manner similar to that shown in FIG. 7. The top layer 54 has a channel 74 in the surface 76 thereof facing upper surface 72 of the middle layer 56. With the top layer 54 disposed on top of the middle layer 56, the channel 74, which is shaped in a manner such as that shown in FIGS. 12, 13 and 14 so as to follow the path of the pads 70, forms a chamber 20 over the pads 70. As in the previous embodiment, chamber 20 is filled with an ionizing gas 22. Using known techniques, a conductive material 78 is disposed on the bottom surface of the channel 74 so as to be equally spaced from all of the pads 70 along the length of the channel 74. The conductive material 78 is grounded (or connected to the lowest potential as previously described) by a connection 80 to one of the pads 70 as shown in FIG. 9 so as to be electrically connected to the proper pin 36 of the integrated circuit chip 62. The conductive material 78 in this regard performs the same function as the conductive material 42 of the previous embodiment. Finally, a conductive material 82 is disposed on the bottom surface 84 of the middle layer 56 so as to be a protective shield for the integrated circuit chip 62. At some point, the conductive material 82 is connected by wire 86 and post 88 to an extra pad 70 provided for the purpose within the chamber 20 as shown in FIG. 10. Thus it will be appreciated that the conductive material 82 of this embodiment acts in the same manner as the conductive material 46 of the previously described embodiment.

Figure 11:
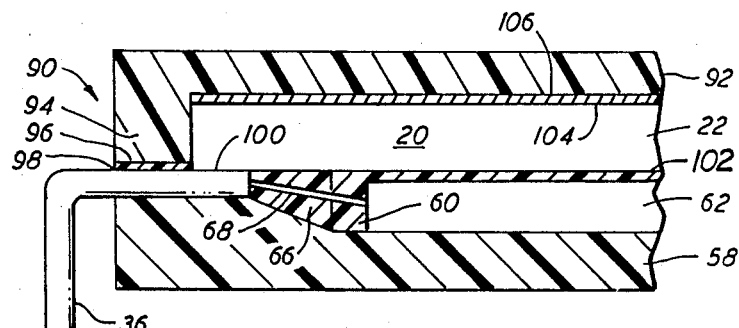
FIG. 11 is a cutaway view through a third embodiment of the present invention.

Turning now to FIG. 11, the present invention is shown in very simple embodiment. As with the embodiment of FIGS. 8-10, the embodiment of FIG. 11 is in the form of a housing 90 designed to hold an integrated circuit chip for mounting in the usual manner. Housing 90 comprises a top layer 92 in a bottom layer 58 substantially identical to the bottom layer 58 of the previous embodiment. Bottom layer 58 includes a space 60 for the chip 62 peripheral slots 64 for the mounting of the mounting pins 36 therein, and connecting slots 66 through which wires 68 interconnecting the chip 62 and the mounting pins 36 are routed. The top layer 92 has a peripheral ridge 94 sealed by an appropriate adhesive 96 to the top surface 98 of the bottom layer 58 and the mounting pins 36 so as to form a gastight chamber 20 over an exposed portion 100 of the mounting pins 36, wires 68 and chip 62. It is preferred that the wires 68 and chip 62 be sealed from exposure to the ionizing gas 22 within chamber 20 such as by the use of potting material 102 as shown. The inner surface 104 at the top of the chamber 20 within the peripheral ridge 94 is coated with a conductive material 106 which is connected to the lowest potential mounting pin 36 as in the previous embodiments by an appropriate connector (not shown). In this embodiment, the exposed portions 100 are exposed to the ionizing gas 22 and perform the function of the pads 28 and 70 in the previous embodiments.

Figure 16:
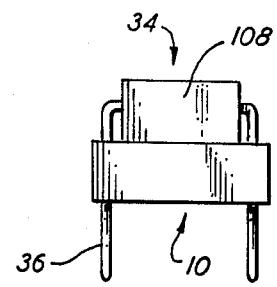
FIG. 16 is an end view of the protector/IC combination of FIG. 15.
Figure 15:
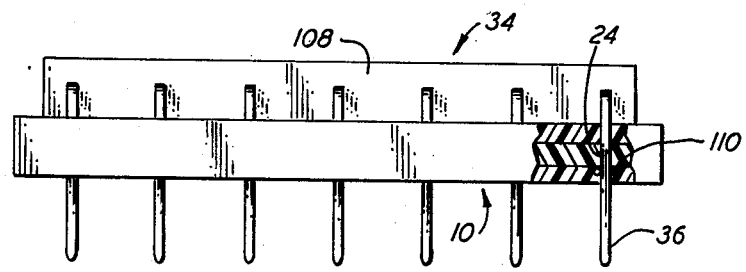
FIG. 15 is a side view showing an integrated circuit mounted on top of a protector according to the present invention with the mounting pins thereof passing through the protector.

Finally, turning to FIGS. 15 and 16, an alternate manner of mounting the protector 10 to a conventional integrated circuit having a housing 108 with mounting pins 36 extending outward and downward therefrom is shown. In this embodiment, the protector 10 has the pins 32 removed therefrom and the bores 24 pass entirely through the layers 12, 14, 16. The electrical leads 30 terminate at the bores 24 in contacts 110 adapted to electrically contact and grip the mounting pins 36 when they are passed through the bores 24 as shown. As can be seen, with the protector 10 disposed close adjacent the bottom of the housing 108 and the mounting pins 36 passing therethrough, the integrated circuit can be mounted to a printed circuit board in the usual manner.

Thus, it can be seen from the foregoing description of the various embodiments described herein that the present invention has met its stated objective by providing an overvoltage or static charge protector for integrated circuits and the like which provides protection from both direct voltages such as an electrostatic discharge event and induced voltages produced thereby or otherwise.

Therefore, having thus described my invention, I claim:

1. An overvoltage protector for a low voltage electrical device having a plurality of electrical connections thereto comprising:
   (a) a housing of an electrically insulating material defining a chamber;
   (b) an ionizable gas disposed within said chamber; and
   (c) a plurality of electrical leads carried by said housing in non-contacting relationship with each other communicating with said chamber and said gas on one end and in electrical contact with respective ones of the electrical connections of the device on the other end.

2. The overvoltage protector of claim 1 and additionally comprising:
   (a) an electrically conductive material disposed in said chamber and spaced substantially equally from all of said one ends of said electrical leads; and
   (b) means for electrically connecting said conductive material to the lowest electrical potential to which the electrical device is connected.

3. The overvoltage protector of claim 1 wherein:
   (a) the overvoltage protector and the electrical device are disposed in closed adjacent spaced relationship; and additionally comprising:
   (b) an electrically conductive material disposed between the overvoltage protector and the electrical device; and
   (c) an electrical lead carried by said housing communicating with said chamber and said gas on one end and in electrical contact with said electrically conductive material on the other end whereby fields which would otherwise induce an overvoltage in the electrical device are caused to discharge their energy by inducing a voltage in said electrically conductive material which is then discharged through said gas.

4. The overvoltage protector of claim 1 wherein: the overvoltage protector and the electrical device are disposed in close adjacent spaced relationship within a common container.

5. The overvoltage protector of claim 1 wherein: the electrical device is disposed within said housing.

6. The overvoltage protector of claim 5 wherein: the electrical device is disposed within said chamber.

7. The overvoltage protector of claim 1 wherein said housing defining said chamber comprises:
   (a) a first printed circuit board having an electrically conductive first surface defining a plurality of electrically exposed points in said chamber and said plurality of electrical leads;
   (b) a second printed circuit board disposed in sealed relationship against said first surface and having an opening therethrough disposed over said plurality of points; and
   (c) a third printed circuit board disposed in sealed relationship against said second printed circuit board whereby said chamber is defined by said first and third printed circuit boards and said opening of said second printed circuit board.

8. The overvoltage protector of claim 7 wherein:
   (a) said third printed circuit board has an electrically conductive second surface adjacent said second printed circuit baord and said chamber; and additionally comprising,
   (b) means for electrically connecting said conductive second surface to the lowest electrical potential to which the electrical device is connected.

9. The overvoltage protector of claim 8 wherein:
   (a) said housing and the electrical device are disposed in close adjacent spaced relationship; and additionally comprising,
   (b) a fourth printed circuit board having an electrically conductive third surface disposed between said housing and the electrical device;
   (c) said first conductive surface of said first printed circuit board defines an extra point and electrical path; and
   (d) an electrical lead carried by said housing communicating with said chamber and said gas on one end and in electrical contact with said electrically conductive third surface on the other end whereby fields which would otherwise induce an overvoltage in the electrical device are caused to discharge energy by inducing a voltage in said electrically conductive third surface which is then discharged through said gas.

10. The overvoltage protector of claim 1 wherein:
    (a) said housing includes a plurality of bores therethrough adapted to have respectives ones of the mounting pins of an integrated circuit module pass therethrough so that the integrated circuit module fits upon said housing and the mounting pins of the integrated circuit project below said housing to allow mounting of the integrated circuit module on a printed circuit board in the usual manner; and
    (b) said electrical leads terminate in respective ones of said bores in contact which grip and electrically mate with the mounting pins therein.

11. A container for an integrated circuit chip or the like providing overvoltage protection for the chip comprising:
    (a) a base portion of an electrically insulating material and including a space therein for holding the integrated circuit chip;

(b) a plurality of mounting pins of an electrically conductive material carried by said base portion and adapted to mate with an electrical circuit board socket;

(c) a plurality of electrically conductive wires electrically connecting the chip to said mounting pins;

(d) means carried by said base portion for defining a chamber;

(e) an ionizable gas disposed within said chamber; and (f) connection means for providing a plurality of electrical paths insulated from one another between respective ones of said mounting pins and respective ones of a plurality of points within said chamber.

12. The container of claim 11 and additionally comprising:

(a) an electrically conductive material disposed in said chamber and spaced substantially equally from all of said points therein; and (b) means for electrically connecting said conductive material to the lowest electrical potential to which the device is connected.

13. The container of claim 11 and additionally comprising:

(a) an electrically conductive material disposed between said chamber and the integrated circuit chip; and (b) an electrical lead communicating between said chamber and said gas on one end and a point and electrical contact with said electrically conductive material on the other end whereby fields which would otherwise induce an overvoltage in the integrated circuit chip are caused to discharge their energy by inducing a voltage in said electrically conductive material which is then discharged through said gas.

14. The container of claim 11 wherein said chamber defining means comprises:

(a) a first printed circuit board having an electrically conductive first surface defining said plurality of points and said plurality of electrical paths;

(b) a second printed circuit board disposed in sealed relationship against said first surface and having an opening therethrough disposed over said plurality of points; and (c) a third printed circuit board disposed in sealed relationship against said second printed circuit board whereby said chamber is defined by said first and third printed circuit boards and said opening of said printed circuit board.

15. The container of claim 14 wherein:

(a) said third printed circuit board has an electrically conductive second surface adajcent said second printed circuit board and,said chamber; and additionally comprising, (b) means for electrically connecting said conductive material to the lowest electrical potential to which the integrated circuit chip is connected.

16. The container of claim 15 wherein:

(a) the integrated circuit chip and third chamber are disposed in close adjacent spaced relationship; and additionally comprising:

(b) a fourth printed circuit board having an electrically conductive third surface disposed between said chamber and the integrated circuit chip;

(c) said first conductive surface of said first printed circuit board defines an extra point and electrical path; and (d) an electrical lead communicating between said chamber and said gas on one end and a point in electrical contact with said electrically conductive third surface on the other end whereby fields which would otherwise induce an overvoltage in the integrated circuit chip are caused to discharge their energy by inducing a voltage in said electrically conductive third surface which is then discharged through said gas.

17. The container of claim 11 wherein said chamber defining means comprises:

(a) a first printed circuit board having a channel formed in a first surface thereof;

(b) a second printed circuit board disposed in sealed relationship against said first surface and having an electrically conductive first surface adjacent said channel defining said plurality of points whereby said chamber is defined by said second printed circuit board and said channel, said first and second printed circuit board being disposed with said channel disposed over said mounting pins; and wherein, (c) said connection means includes a plurality of contact members disposed through said second printed circuit board and electrically interconnecting respective ones of said points of said first surface and said mounting pins.

18. The container of claim 17 and additionally comprising:

a conductive material disposed along the length of the bottom of said channel and connected to the lowest electrical potential to which the chip is connected.

19. The container of claim 17 and additionally comprising:

said second printed circuit board having a conductive second surface on the side opposite said first surface, said second surface being disposed over said chip, and insulated therefrom, and being molecularly connected to a point on said first surface within said chamber whereby seals which would otherwise induce an overvoltage in said chip are caused to discharge their energy by inducing a voltage in said conductive second surface which is then discharged through said gas.

20. The container of claim 11 wherein said chamber defining means comprises:

(a) a first printed circuit board having a channel formed in a first surface thereof disposed in sealed relationship against said base portion whereby said chamber is defined by said channel and said base portion, said channel being sized and positioned such that a portion of each of said mounting pins is electrically exposed within said chambers; and additionally comprising, (b) a conductive material disposed along the length of the bottom of said channel and connected to the lower electrical potential to which the chip is connected.

21. The container of claim 20 and additionally comprising:

(a) an electrically conductive material disposed over said space; and (b) an electrical lead connecting said conductive material to an independent one of said plurality of points within said chamber whereby fields which would otherwise induce an overvoltage in the chip are caused to discharge their energy by inducing a voltage in said electrically conductive material which is then discharged through said gas.

* * * * *